United States Patent
Allen et al.

(10) Patent No.: US 8,219,785 B1
(45) Date of Patent: Jul. 10, 2012

(54) ADAPTER ALLOWING UNALIGNED ACCESS TO MEMORY

(75) Inventors: Timothy P. Allen, Santa Cruz, CA (US); Jeffrey Orion Pritchard, Santa Cruz, CA (US); Richard Noble Hill, McHenry, IL (US)

(73) Assignee: Altera Corporation, San Jose, CA (US)

( * ) Notice: Subject to any disclaimer, the term of this patent is extended or adjusted under 35 U.S.C. 154(b) by 398 days.

(21) Appl. No.: 11/527,201

(22) Filed: Sep. 25, 2006

(51) Int. Cl.
*G06F 9/30* (2006.01)

(52) U.S. Cl. .............. 712/204; 712/220

(58) Field of Classification Search .......... 712/220, 712/204
See application file for complete search history.

(56) References Cited

U.S. PATENT DOCUMENTS

| | | | | |
|---|---|---|---|---|
| 5,497,468 A * | 3/1996 | Tani et al. | | 712/225 |
| 5,519,842 A * | 5/1996 | Atallah et al. | | 711/202 |
| 5,577,200 A * | 11/1996 | Abramson et al. | | 714/50 |
| 5,822,559 A * | 10/1998 | Narayan et al. | | 712/214 |
| 5,822,620 A * | 10/1998 | Malik et al. | | 712/300 |
| 5,860,104 A * | 1/1999 | Witt et al. | | 711/137 |
| 6,061,779 A * | 5/2000 | Garde | | 712/204 |
| 6,070,182 A * | 5/2000 | Rao et al. | | 708/708 |
| 6,076,136 A * | 6/2000 | Burroughs et al. | | 711/5 |
| 6,242,269 B1 * | 6/2001 | Whetsel | | 438/11 |
| 6,512,716 B2 * | 1/2003 | Oberlaender et al. | | 365/230.02 |
| 6,704,854 B1 * | 3/2004 | Meier et al. | | 712/204 |
| 6,728,865 B1 * | 4/2004 | Coon et al. | | 712/204 |
| 6,820,195 B1 * | 11/2004 | Shepherd | | 712/300 |
| 6,993,619 B2 * | 1/2006 | Augsburg et al. | | 710/307 |
| 7,093,058 B2 * | 8/2006 | Angsburg et al. | | 710/317 |
| 2001/0049593 A1 * | 12/2001 | McConnell et al. | | 703/14 |
| 2005/0028126 A1 * | 2/2005 | Kan et al. | | 716/17 |
| 2005/0144416 A1 * | 6/2005 | Lin | | 711/201 |
| 2006/0031705 A1 * | 2/2006 | Augsburg et al. | | 713/600 |
| 2006/0036817 A1 * | 2/2006 | Oza et al. | | 711/155 |
| 2006/0184738 A1 * | 8/2006 | Bridges et al. | | 711/125 |
| 2006/0200649 A1 * | 9/2006 | Singh et al. | | 712/220 |
| 2006/0259746 A1 * | 11/2006 | Kunie | | 712/225 |
| 2007/0038847 A1 * | 2/2007 | Yeh et al. | | 712/225 |
| 2007/0050592 A1 * | 3/2007 | Gschwind et al. | | 711/201 |
| 2007/0113215 A1 * | 5/2007 | Duan et al. | | 716/16 |

OTHER PUBLICATIONS

Intel, "How to Reduce the Impact of Misaligned Memory Accesses", downloaded from www.intel.com on Apr. 18, 2007.

* cited by examiner

*Primary Examiner* — Idriss N Alrobaye
(74) *Attorney, Agent, or Firm* — Weaver Austin Villeneuve & Sampson LLP

(57) ABSTRACT

Methods and apparatus are provided for allowing a master component such as a processor on a programmable chip to access memory using unaligned addresses. An adapter connected to a master component determines if a master component memory access request is aligned. If the access request is aligned, the request is forwarded to memory and a response is provided to the master component. If the access request is unaligned, the adapter sends multiple access requests to memory and processes the responses in order to provide a correct response to the master component.

18 Claims, 7 Drawing Sheets

ADAPTER ALLOWING UNALIGNED ACCESS TO MEMORY

BACKGROUND OF THE INVENTION

1. Field of the Invention

The present invention relates to unaligned access to memory. In one example, the present invention relates to methods and apparatus for allowing unaligned access to memory using an adapter on a programmable device.

2. Description of Related Art

Systems that use memory typically have addresses associated with various memory lines. In some instances, each memory line is one byte in length. Every byte in memory is provided with a unique address. In these systems, master components such as processors, Direct Memory Access (DMA) controllers, Ethernet controllers, etc., access memory using byte aligned addresses. Each memory read or write operation has an associated address. The address indicates which byte or corresponding memory line is being accessed.

To increase performance, multiple bytes of memory are often accessed simultaneously. For example, a 32-bit processor accesses 4 bytes at a time. A 64-bit processor would access 8 bytes at a time. This remains true even if there actually are only a few bits of useful information included in the 8 bytes. Nonetheless, the master component reads the few bits of useful information by providing the address of the first byte of the 8 byte memory block. For any wide-access, the multiple target bytes in memory are located at contiguous addresses.

Similarly, a 32-bit-wide memory produces four bytes on its data-port for any read-operation even if the accessing master component is only interested in the byte at address 0. The bytes at addresses 1, 2, and 3 will be read from the memory anyway. Wide memories are universally built such that all read and write accesses must be aligned. An aligned access is one where the byte-address is evenly-divisible by the width of the memory (in bytes). Thus, an aligned-access to a 32-bit-wide memory would be any access to an address divisible by four. Read and write operations to a 32-bit-wide (4-byte-wide) memory are made to addresses 0, 4, 8, 12, 16, etc. Read and write operations to 64-bit (8-byte-wide) memory are made to addresses 0, 8, 16, 24, 32, and so on.

In some systems, issuing an unaligned read or write operation to a wide memory will produce an undefined result. In most systems, an unaligned read or write operation will behave as if the address were truncated downward or rounded downward to the next-lower aligned address.

However, conventional mechanisms for allowing unaligned access to memory are limited, particularly for programmable devices. Consequently, the techniques of the present invention provide additional efficient mechanisms for allowing unaligned memory access.

SUMMARY OF THE INVENTION

Methods and apparatus are provided for allowing a master component such as a processor on a programmable chip to access memory using unaligned addresses. An adapter connected to a master component determines if a master component memory access request is aligned. If the access request is aligned, the request is forwarded to memory and a response is provided to the master component. If the access request is unaligned, the adapter sends multiple access requests to memory and processes the responses in order to provide a correct response to the master component.

In one embodiment, a programmable device is provided. A processor core includes a processor core master data port. A memory includes a memory slave data port. An unaligned access adapter includes an unaligned access adapter slave data port and an unaligned access adapter master data port. The unaligned access adapter slave data port is connected to the processor core master data port and the unaligned access adapter master data port is connected to the memory slave data port. The unaligned access adapter is operable to receive an unaligned memory access request from the processor core and send a plurality of aligned memory access requests In another embodiment, a technique is provided for processing unaligned memory access requests. A memory access request is received from a master component included on a programmable device. The memory access request is received at an unaligned access adapter. It is determined that the memory access request is unaligned. Multiple aligned memory access requests are sent to memory. The multiple aligned memory access requests are sent from the unaligned access adapter. The multiple responses corresponding to the multiple aligned memory access requests are combined. A combined response is provided to the master component.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DESCRIPTION OF EXAMPLE EMBODIMENTS

Figure 1:
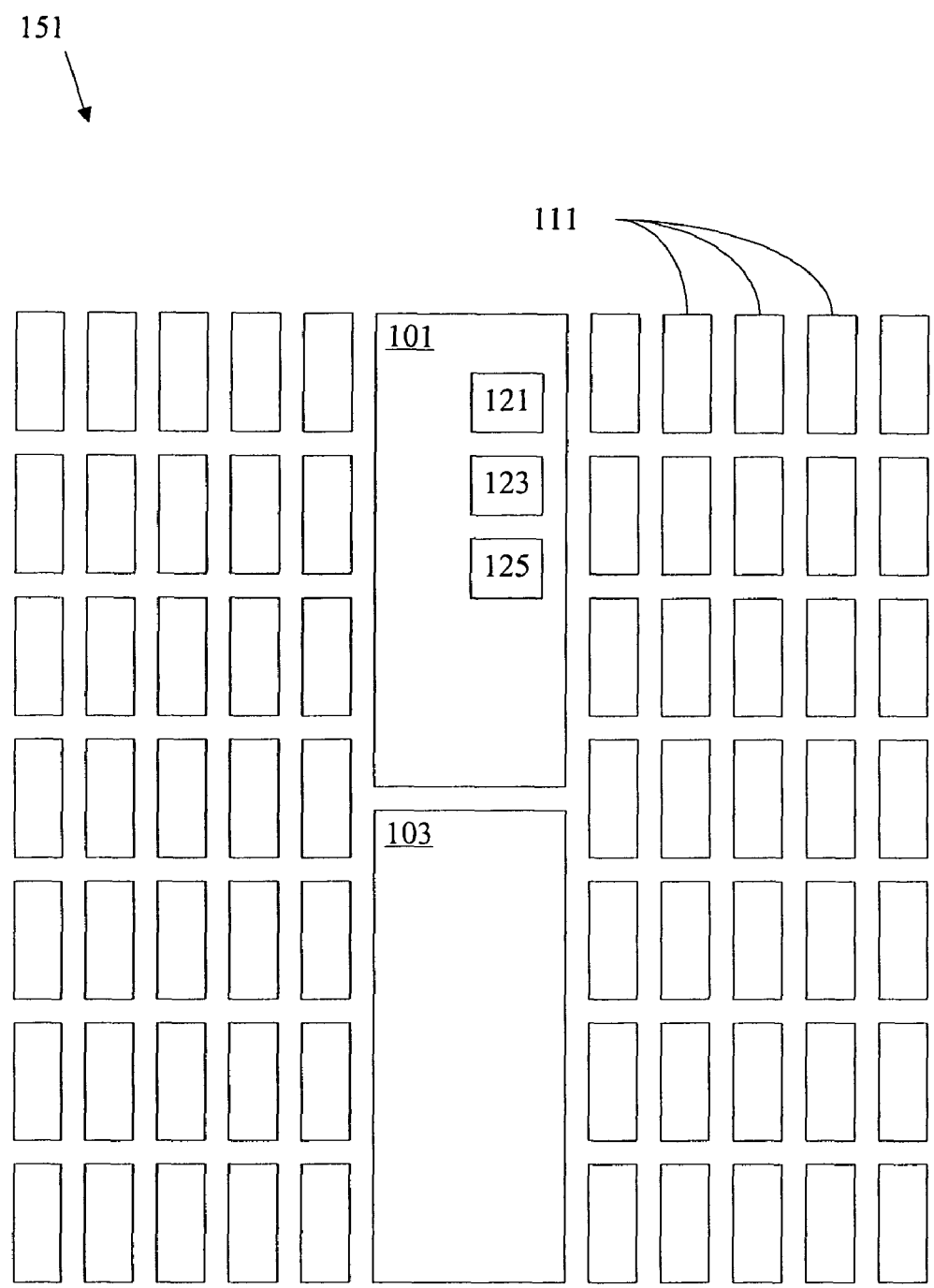
FIG. 1 is a diagrammatic representation of a programmable chip.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of master components and memory. However, it should be noted that the techniques of the present invention can be applied to a variety of components and types of memory. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted.

In some systems, a master component such as a processor issuing an unaligned read or write memory access to a memory will produce an undefined result. In many other systems, a master component issuing an unaligned read or write memory access to a memory will result in the memory access address being truncated downward to the next lower aligned address. Unaligned memory accesses may be attempted, but in neither case are the results accurate. Most electronic systems that include wide memories require that all accesses to memory be aligned accesses.

However, it is recognized that it is desirable for a master component such as a processor to be able to issue unaligned accesses. In many applications including data processing and networking applications, data resides in memory as a sequential stream of bytes. This byte-stream may have come from a network port. A wide variety of programs manipulate network data in memory. For example, the programs often examine or modify data fields in a packet, such as packet headers, network addresses, labels, flags, etc. These fields and subfields are often several bytes long, and can occur at arbitrary locations in the packet-stream. Programmers creating packet-manipulation software often need to be able to access multi-byte values from memory, whether those values occur at an aligned address or not.

Indeed, it is burdensome for programmers to consider, for every memory access, whether the target-bytes reside at an aligned address or not. Many software-bugs result from software mistakenly issuing a multi-byte memory read or write operation to an unaligned address. In practice, it is often difficult to guarantee that every single one of the thousands (or even millions) of memory-access operations is properly-aligned.

Some systems simply require aligned accesses. If an unaligned access is made, some of the systems will detect the unaligned access and throw a bus error or memory access exception. Other systems will not detect the unaligned access and actually access the wrong data, creating difficult to detect errors.

Other systems wrap memory access operations in a software macro or function that checks for alignment before performing an access. If the address is aligned, the access takes place uninterrupted. If the address is unaligned, the wrapper executes two memory-operations to the two aligned addresses that include the target data.

One example of a wrapper is described below. The is_aligned_32 utility function determines whether an address is aligned.

```
int is_aligned_32 (void* byte_address)
{
  int address_as_an_integer=(int) byte_address;
  // An address is aligned if its divisible evenly by four:
    // note: '%' is the "remainder" operation in C
    //
    return (address_as_an_integer % 4==0);
}
```

The truncate_to_aligned address gives the next-lowest aligned address from an unaligned address.

```
int32* truncate_to_aligned_address (void* byte_address)
{
  int address_as_an_integer=(int) byte_address;
  // Trick: Setting the lowest two bits of the address to
  // zero truncates a number to be divisible by four.
  //
  return    (int32*)    (address_as_an_integer  &
     0xFFFFFFFC);
}
```

The get_misalignment_amount returns the amount of misalignment.

```
int get_misalignment_amount (void* byte_address)
{
  return (int)(byte_address) % 4;
}
```

The safe_32_bit_read function is called by programmers to allow unaligned memory reads without unpredictable results. If the address is aligned, memory is accessed without further processing. If the address is not aligned, the data is assembled after accessing two aligned memory blocks. That is, in order to make an unaligned memory access, two aligned memory accesses have to be made obtain the appropriate data, referred to as lo_bytes and hi_bytes. The appropriate data from the two aligned memory accesses has to be extracted and shifted into the right positions. The acquired data is then provided as a single response, in this case a 32-bit response, to an unaligned 32-bit read.

```
int32 safe_32_bit_read (void* byte_address)
{
    if (is_aligned_32 (byte_address))
    {
       // Address is aligned! Just get the four bytes from
       // memory like a normal person, and return:
       //
       return *((int32*) byte_address);
    } else {
    int32 lo_bytes;
    int32 hi_bytes;
    int32 result;
       lo_bytes = *(truncate_to_aligned_address (byte_address));
       hi_bytes = *(truncate_to_aligned_address (byte_address) + 1);
       result = lo_bytes >> get_misalignment_amount(byte_address);
       result |= hi_bytes >> (4-get_misalignment_amount(byte_address);
       return result;
    }
}
```

A programmer would be required to call the safe_32_bit_read function to allow unaligned memory reads without incorrect results. The programmer would call the safe_32_bit_read function to read any 32-bit (four-byte) value from memory. The programmer would also need to construct a similar safe_32_bit_write function, and call it at all the right times as well.

However, there are significant drawbacks to using a wrapper function. The programmer must, consciously, call dedicated functions or macros to guarantee alignment safety. Thus, the programmer must be able to accurately predict which memory-access operations might end-up unaligned. In practice, this is notoriously difficult and error prone. Furthermore, performing all the checks and conversions in software for every memory-read or write-operation is extremely inefficient. An operation that should take a few clock cycles as possible ends up taking dozens of clock cycles. Master components access memory very frequently. All of the safe-alignment software processing results in an order-of-magnitude reduction in application performance.

Another solution calls for configuring a processor to detect and fix unaligned memory access. Intel Pentium™ processors available from Intel Corporation, Santa Clara, Calif., include hardware in the processor that detect and fixes unaligned accesses. Intel processors check to see if a memory access. If the access is aligned, the processor simply performs the aligned access. If the access is not aligned, the processor executes two aligned accesses and combines the two partial results. The techniques and mechanisms of the present invention recognize that such circuits are nice to have, but the circuits are expensive in the context of programmable devices. To fix an unaligned access requires a 32-bit barrel shifter. Barrel shifters are relatively expensive on programmable devices. It is recognized that such a circuit could increase the size of a processor significantly. Such a circuit also requires control logic that monitors the outgoing memory address and stalls the processor if an unaligned access is detected. Memory access and stall logic are, almost always, the critical-paths in pipelined processors. The introduction of such an alignment correction circuit would tend to reduce the maximum frequency of a processor and increase its cost.

Many embedded systems include processors that simply do not allow unaligned accesses. For example, Nios™ and Nios II™ processors available from Altera Corporation of Santa Clara, Calif., were designed to provide the smallest and fastest processor possible. Consequently, no misalignment circuitry was included in the processor. Most embedded system developers are cognizant about unaligned access and wrapper functions could always be used to supplement developer care.

However, the techniques of the present invention recognize that it is possible to further improve handling of unaligned memory access. The techniques and mechanisms of the present invention contemplate an unaligned access adapter that can be used with any master component to allow possible unaligned memory access to memory. Any component operable to perform an aligned memory access when an aligned memory access is received from a master component and perform multiple aligned memory accesses when an unaligned memory access is received from a master component is referred to herein as an unaligned access adapter. According to various embodiments, the unaligned access adapter is an intellectual property block available from a library of components. The unaligned access adapter can be used to connect a master component or any component having a master port such as a processors, Ethernet controllers, DMA controllers, and hardware accelerators with memory. When the master component performs a memory access, the master component sends the request to the adapter. The adapter checks the memory access. If the memory access is aligned, the adapter forwards the request to memory. If the memory access is not aligned, the adapter performs processing to allow alignment. In one example, the adapter sends two aligned memory requests to memory and performs combination and truncation to operate on the correct memory address range.

By using an adapter, the techniques of the present invention provide developers with a choice of whether they would accept using additional resources on a programmable chip and paying a performance penalty in order to allow development without having to worry about any alignment restrictions. The processor does not have to be modified. Other master components do not have to be modified. Instead, a single unaligned access adapter can be used with a variety of master components.

FIG. 1 is a diagrammatic representation showing one example of a programmable chip that can use the techniques of the present invention. Any device such as a Field Programmable Gate Array (FPGA) or a Programmable Logic Device (PLD) that is configurable using a hardware descriptor language (HDL) such as Verilog or VHDL is referred to herein as a programmable chip. A programmable chip 151 includes logic elements 111, embedded memory 103, as well as other resources such as hard coded logic blocks 101. The programmable chip uses different types of resources that can be interchangeably used in different allocations to implement a programmable chip. In one example, the programmable chip uses a mix of logic elements, embedded memory, and hard-coded logic for implementing each of the various components on the programmable chip.

According to various embodiments, embedded memory 103 is a 32-bit embedded memory that requires aligned access. The programmable chip may also be connected to an external memory block that requires aligned access.

According to various embodiments, the logic resources are logic elements (LEs) 111, logic array blocks (LABs) or logic cells. Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

Logic elements can also be used to implement soft processors as well as other components such as hardware accelerators, peripheral devices, and peripheral interfaces. Peripheral devices and peripheral interfaces are herein referred to as components. In some embodiments, a system on a programmable chip can be implemented on the programmable chip 151. The programmable chip system components are connected using an interconnection fabric. Any mechanism or logic for connecting components in a system is referred to herein as an interconnection fabric. In one example, the interconnection fabric is a bus. In another example, the interconnection fabric is a slave side arbitration fabric that associates slave components with individual arbiters to allow a first master component to access a first slave component at the same time a second master component is accessing a second slave component.

In some examples, the hard coded logic blocks 101 are DSP blocks that can efficiently implement multiplication, multiply-accumulate (MAC) and multiply-add functions. In one example, the hard coded logic block 101 includes a multiplier 121, an adder 123, and an accumulator 125. The multipliers can be configured to feed an adder or an accumulator.

In many implementations, an unaligned access adapter is implemented using logic elements 111. The unaligned access adapter uses valuable resources on a programmable device and decreases performance, but allows development without concerns of unaligned memory access by a master component.

Figure 2:
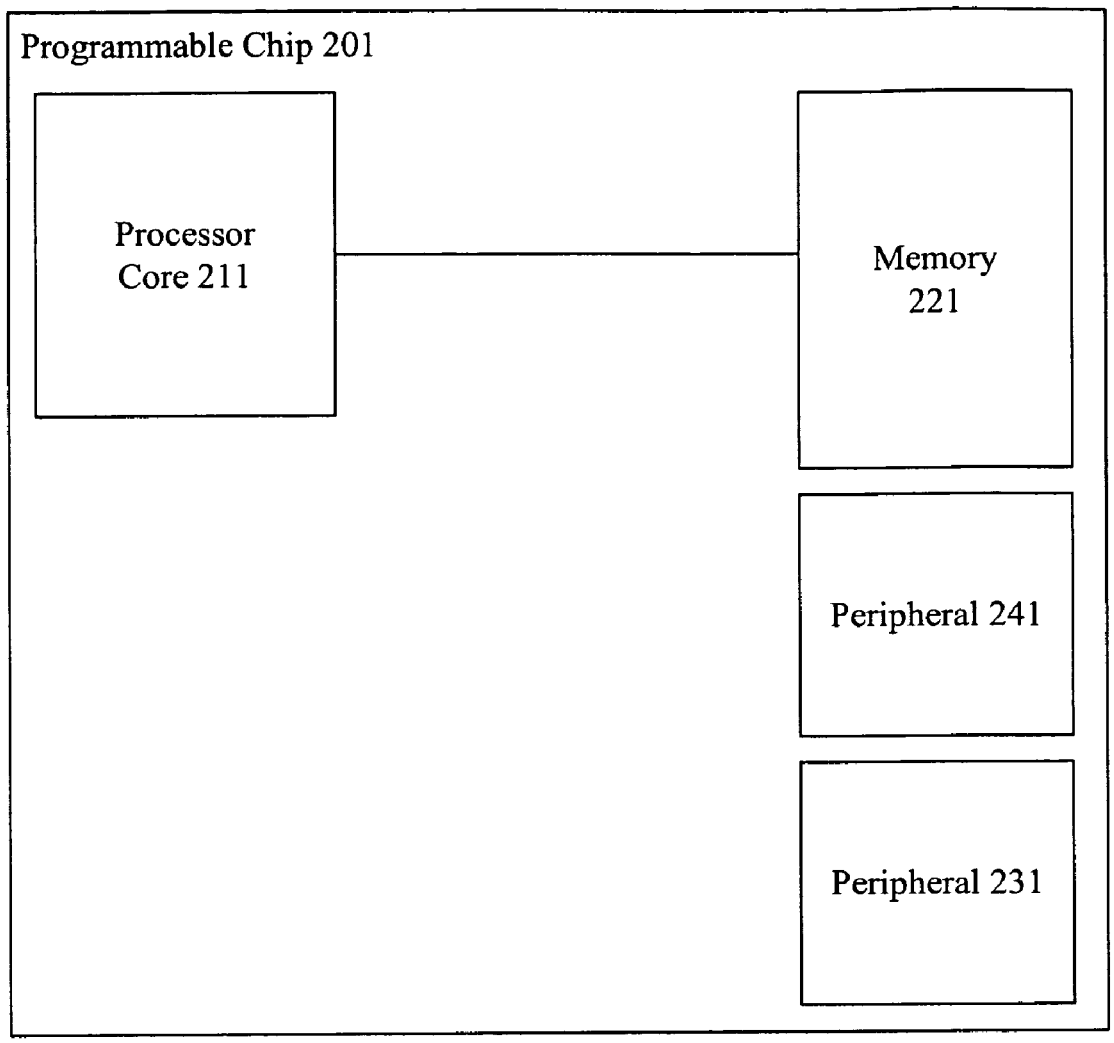
FIG. 2 is a diagrammatic representation showing programmable chip components.

FIG. 2 is a diagrammatic representation showing one example of a programmable chip having a memory configured for address aligned access. The programmable chip 201 includes a processor core 211. According to various embodiments, the processor core 211 is a soft core available from an intellectual property core library and the processor core 211 is configured using logic elements. In other examples, the processor core 211 is a hard-wired processor core included on the programmable chip 201. The processor core 211 is one of a variety of components that can access a memory 221. A hardware accelerator and an Ethernet controller are other components that can use address aligned memory 221.

Memory 221 includes a slave data port that is connected to a processor core 211 master data port. Many processors access data aligned in a particular way. Many memory components require addresses aligned in a particular way. Memory alignment entails accessing data at memory addresses that are evenly divisible by particular numbers. For example a 32-bit processor may require an integer data value to reside at an address divisible by 16 or 32. In a simplified example, data may only be accessed by issuing reads or writes at addresses 0x0010 and 0x0020. An access to address 0x001A would either cause a memory fault, return data at the next lowest aligned address 0x0010, or access data in some other unexpected manner.

The memory 221 can be accessed through an interconnection fabric such as a bus or an Avalon™ slave side arbitration fabric available from Altera Corporation of San Jose, Calif. The memory 221 may also be directly connected to a master component such as a processor to allow direct access without having to go through a mechanism such as a bus. According to various embodiments, the programmable chip 201 also includes other peripherals 231 and 241, such as network interfaces, timers, receiver/transmitters, etc.

Figure 3:
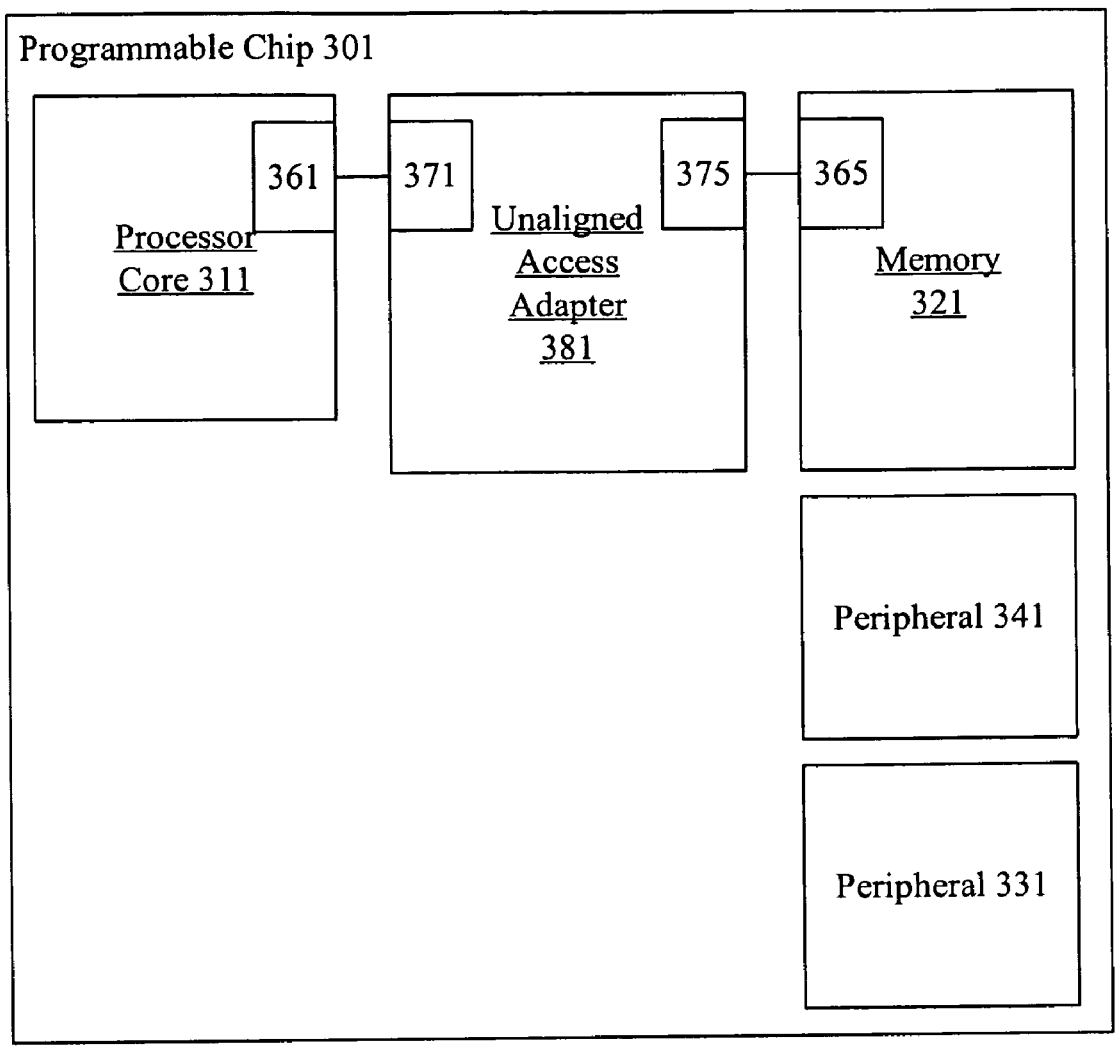
FIG. 3 is a diagrammatic representation showing an unaligned access adapter.

FIG. 3 is a diagrammatic representation showing one example of a programmable chip having a memory configured for address aligned access. The programmable chip 301 includes a processor core 311. According to various embodiments, the processor core 311 is a soft core available from an intellectual property core library and the processor core 311 is configured using logic elements. In other examples, the processor core 311 is a hard-wired processor core included on the programmable chip 301. The processor core 311 is one of a variety of components that can access a memory 321. A hardware accelerator and an Ethernet controller are other components that can use address aligned memory 321.

Memory 321 includes a slave data port that is connected to a processor core 311 master data port. Many processors access data aligned in a particular way. Many memory components require addresses aligned in a particular way. Memory alignment entails accessing data at memory addresses that are evenly divisible by particular numbers. For example a 32-bit processor may require an integer data value to reside at an address divisible by 16 or 32. In a simplified example, data may only be accessed by issuing reads or writes at addresses 0x0010 and 0x0020. An access to address 0x001A would either cause a memory fault, return data at the next lowest aligned address 0x0010, or access data in some other unexpected manner.

Consequently, the techniques of the present invention provide an unaligned access adapter 381. The unaligned access adapter 381 includes multiple ports. According to various embodiments, a processor core 311 master port 361 is connected to an unaligned access adapter 381 slave port 371. An unaligned access adapter 381 master port 375 is connected to a memory 321 slave port 365. It should be noted that a variety of other ports may also be included. The processor core 311 no longer accesses memory 321 directly. Instead, the processor core 311 accesses memory 321 through the adapter 381.

According to various embodiments, when the processor core 311 issues aligned accesses to memory 321, the adapter 381 does minimal processing. The address is passed through to memory 321, and the data is returned to the processor core 311 without excessive adapter processing. However, it should be noted that this still may introduce some delay into the critical path. When the processor core 311 issues an unaligned memory access to memory, the adapter 381 detects the unaligned access. According to various embodiments, the adapter 381 instructs the processor core 311 to wait. In one embodiment, a wait signal associated with an interconnection fabric is used. While the processor core 311 waits, the adapter 381 issues two accesses to memory 321, extracts the unaligned bytes requested by the processor core 311, and returns the data to the processor core 311.

The memory 321 can be accessed through an interconnection fabric such as a bus or an Avalon™ slave side arbitration fabric available from Altera Corporation of San Jose, Calif. The memory 321 may also be directly connected to a master component such as a processor to allow direct access without having to go through a mechanism such as a bus. According to various embodiments, the programmable chip 301 also includes other peripherals 331 and 341, such as network interfaces, timers, receiver/transmitters, etc.

Figure 4:
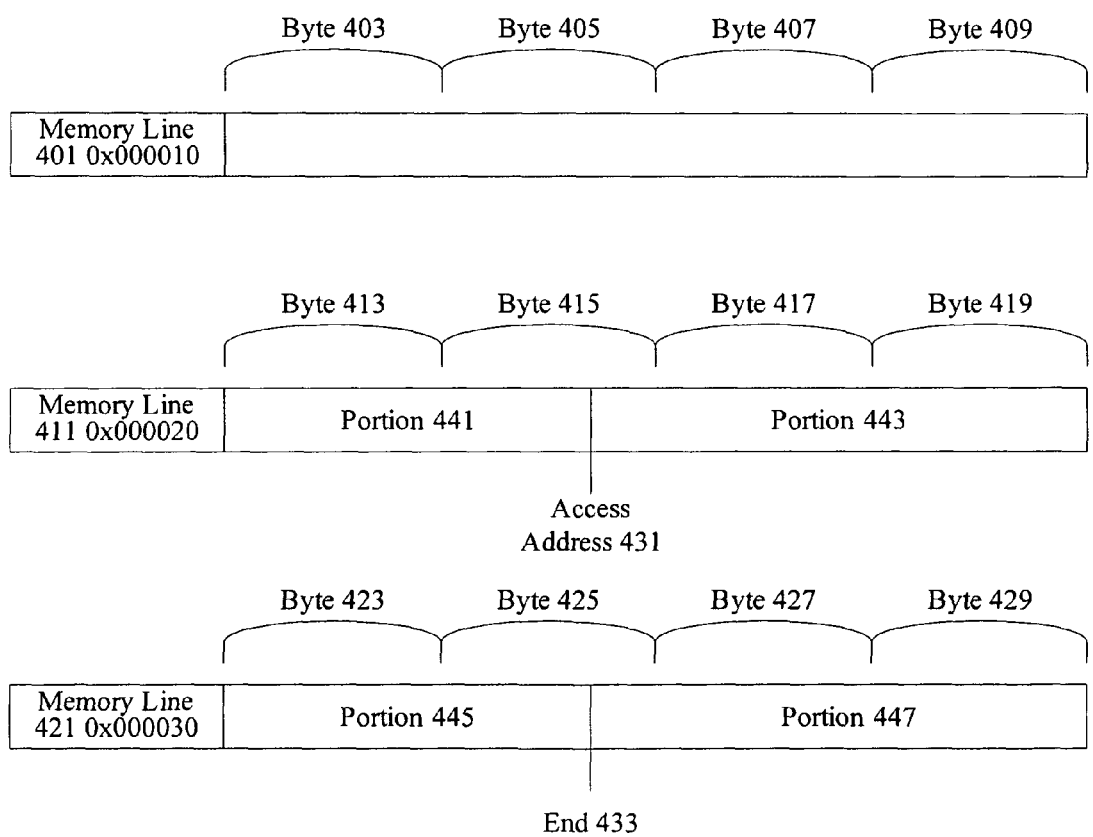
FIG. 4 is a diagrammatic representation showing a memory.

FIG. 4 is a diagrammatic representation showing a memory. According to various embodiments, each memory line 401, 411, and 421 include four bytes and is associated with an aligned access address. Some configurations provide aligned addresses at every byte. Others allow addresses at every two or four bytes. Memory line 401 has aligned access address 0x0010 and has four bytes 403, 405, 407, and 409. Memory line 411 has aligned access address 0x000020 and has four bytes 413, 415, 417, and 419. Memory line 421 has aligned access address 0x000030 and has four bytes 423, 425, 427, and 429. In typical implementations, a master component accesses memory line 401 using the address 0x000010 to access bytes 403, 405, 407, and 409. In some implementations, if a master component provides an unaligned or unaligned address such as 0x000011 or 0x00001D, memory line 401 is still provided. Otherwise, a memory fault or some other unpredictable event may occur.

However, according to various embodiments, the techniques and mechanisms of the present invention contemplate providing correct data even in the event of unaligned or misaligned memory access. For example, a master component may access a memory access request using an access address 431 of 0x000026. According to various embodiments, the adapter recognizes that the address 0x000026 is an unaligned address and works to obtain four bytes of data from access address 431 to end address 433. The data from an unaligned access address 431 to an end address 433 based on memory line length is referred to herein as an unaligned access address range.

According to various embodiments, the adapter accesses both memory lines 411 and 421 to obtain portions 443 and 445. Portions 441 and 447 are truncated or removed. Portions 443 and 445 include four bytes of data that are returned to the master component. In some embodiments, it may be possible for a master component to specify a specific length of data to be returned. Consequently, the adapter can be configured to obtain multiple memory lines as needed in order to obtain the specified length of data. Alternatively, the adapter may be configured to truncate acquired data and provide the remaining data to a master component.

Figure 5:
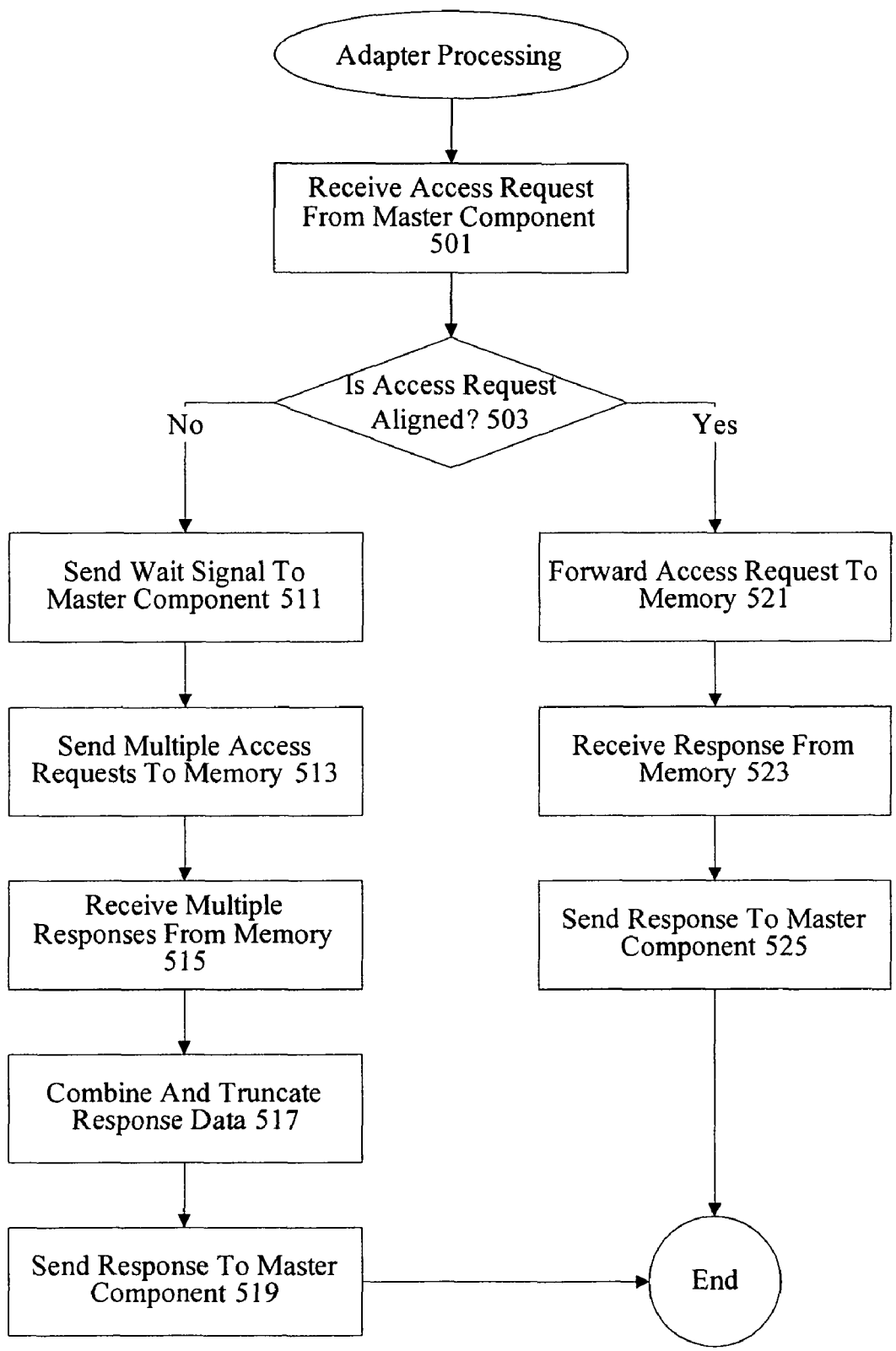
FIG. 5 is a flow process diagram depicting one technique for handling memory access.

FIG. 5 is a flow process diagram showing adapter processing. According to various embodiments, an unaligned access adapter can be used to handle unaligned access read and write operations, as well as other possible test and set operations. At 501, the adapter receives an access request from a master component. A single adapter may be configured to handle requests from a variety of different master components. It is determined at 503 if the access request is aligned. If the access request is aligned, the access request is forwarded to memory at 521. A response is received from memory at 523 and the response is sent to the master component at 525. If the memory access is aligned, minimal processing is performed. However, if the memory access is unaligned at 503, a wait signal may need to be sent to the master component at 511. The adapter then sends multiple access requests to memory at 513. In some examples, two access requests are sent in order to obtain the necessary response. At 515, multiple responses are received from memory. At 517, response data is combined and truncated as needed. The response is then sent to the master component at 519.

Figure 6:
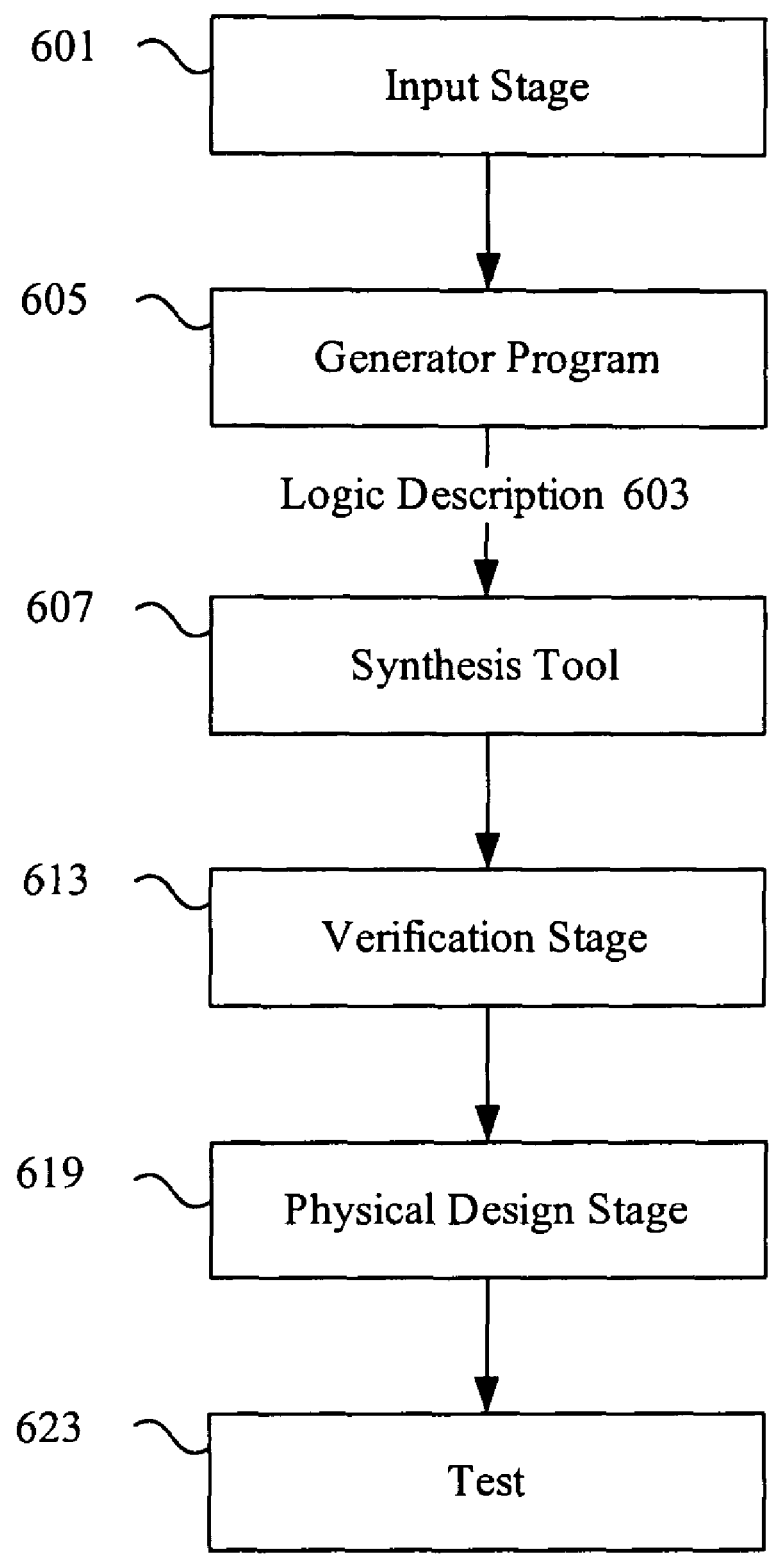
FIG. 6 is a diagrammatic representation showing a technique for implementing the programmable chip.

FIG. 6 is a diagrammatic representation showing implementation of an electronic device that can use the techniques of the present invention. An input stage 601 receives selection information typically from a user for logic such as a processor core as well as other components to be implemented on an electronic device. In one example, the input received is in the form of a high-level language program. A generator program 605 creates a logic description and provides the logic description along with other customized logic to any of a variety of synthesis tools, place and route programs, and logic configuration tools to allow a logic description to be implemented on an electronic device.

In one example, an input stage 601 often allows selection and parameterization of components to be used on an electronic device. The input stage 601 also allows configuration of hard coded logic. In some examples, components provided to an input stage include intellectual property functions, megafunctions, and intellectual property cores. The input stage 601 may be a graphical user interface using wizards for allowing efficient or convenient entry of information. The input stage may also be a text interface or a program reading a data file such as a spreadsheet, database table, or schematic to acquire selection information. The input stage 601 produces an output containing information about the various modules selected.

In typical implementations, the generator program 605 can identify the selections and generate a logic description with information for implementing the various modules. The generator program 605 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 605 identifies pointers and provides ports for each pointer. One tool with generator program capabilities is System on a Programmable Chip (SOPC) Builder available from Altera Corporation of San Jose, Calif. The generator program 605 also provides information to a synthesis tool 607 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 609.

As will be appreciated by one of skill in the art, the input stage 601, generator program 605, and synthesis tool 607 can be separate programs. The interface between the separate programs can be a database file, a log, or simply messages transmitted between the programs. For example, instead of writing a file to storage, the input stage 601 can send messages directly to the generator program 605 to allow the generator program to create a logic description. Similarly, the generator program can provide information directly to the synthesis tool instead of writing HDL files. Similarly, input stage 601, generator program 605, and synthesis tool 607 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 607.

A synthesis tool 607 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 613 typically follows the synthesis stage 607. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 613, the synthesized netlist file can be provided to physical design tools 619 including place and route and configuration tools. A place and route tool typically locates logic cells on specific logic elements of a target hardware device and connects wires between the inputs and outputs of the various logic elements in accordance with logic required to implement an electronic design. The device can also be physically tested at 623.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 601, the generator program 605, the synthesis tool 607, the verification tools 613, and physical design tools 619 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 7:
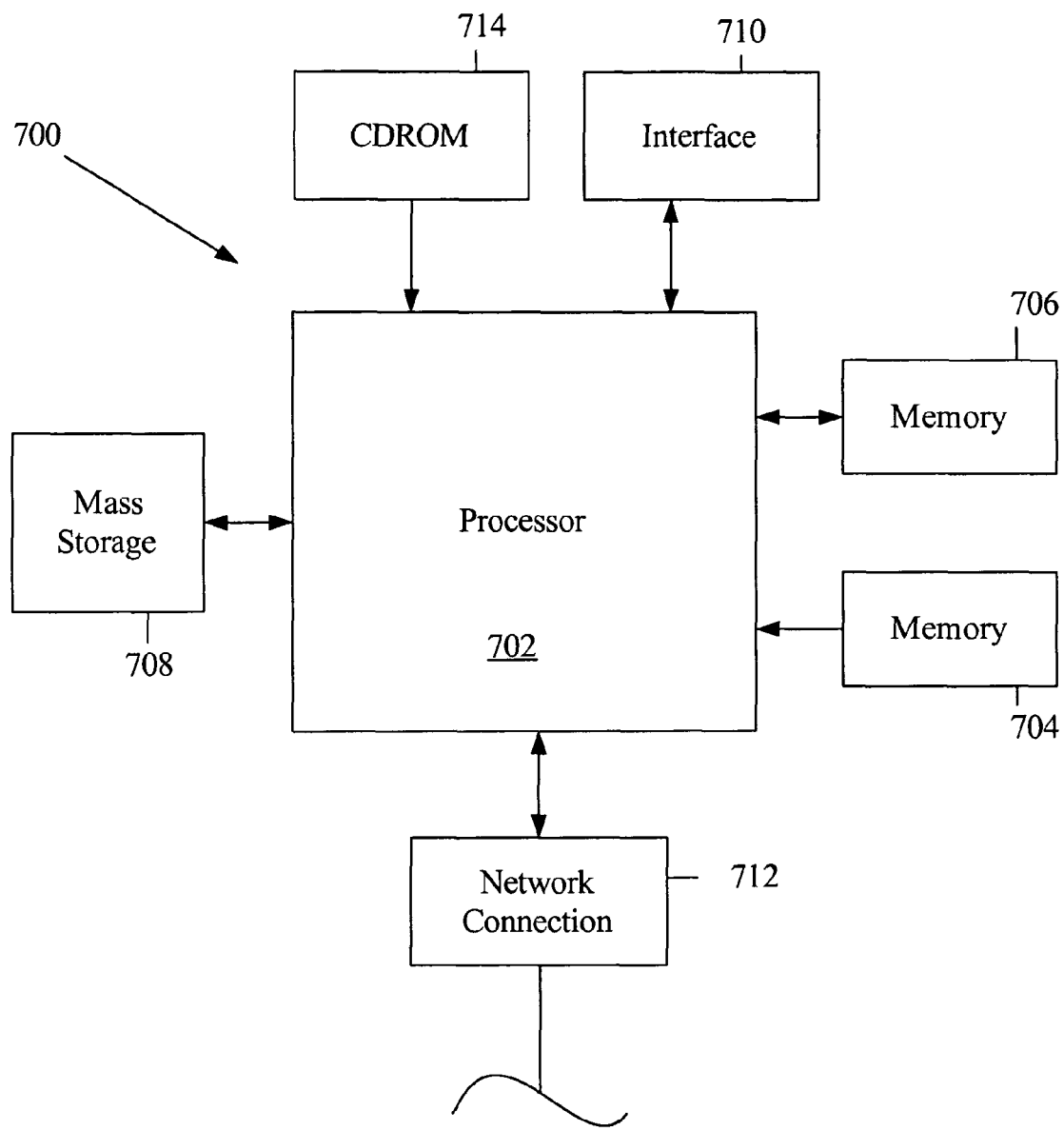
FIG. 7 is a diagrammatic representation depicting a computer system.

FIG. 7 is a diagrammatic representation showing a typical computer system that can be used to implement a programmable chip having bus arbitration with priority encoding and fairness. The computer system 700 includes any number of processors 702 (also referred to as central processing units, or CPUs) that are coupled to devices including memory 706 (typically a random access memory, or "RAM"), memory 704 (typically a read only memory, or "ROM"). The processors 702 can be configured to generate a test sequences for any designated processor. As is well known in the art, memory 704 acts to transfer data and instructions uni-directionally to the CPU and memory 706 is used typically to transfer data and instructions in a bi-directional manner.

Both of these memory devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than memory. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of memory 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. It should be noted that the system 700 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 708 or 714 and executed on CPU 708 in conjunction with primary memory 706.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A programmable device comprising:
   a processor core including a processor core master data port;
   a memory including a memory slave data port; and
   an unaligned access adapter operable to receive unaligned memory access requests from a plurality of master components, wherein the unaligned access adapter is a component available from a library of components,
   wherein the plurality of master components includes the processor core and a peripheral implemented on the programmable device,
   wherein the unaligned access adapter receives unaligned memory access requests from the processor core via the processor core master data port, wherein the unaligned access adapter is operative to stall the processor core responsive to receiving an unaligned memory access request,
   wherein the unaligned access adapter is further operable to send a memory access request to the memory, wherein the memory access request corresponds to an unaligned access address range that is obtained from a plurality of responses to a plurality of aligned memory accesses,
   and wherein the unaligned access adapter is further operable to combine and truncate the plurality of responses corresponding to the plurality of aligned memory access requests to form a combined response.

2. The programmable device of claim 1, wherein an unaligned memory access request corresponds to an unaligned access address range.

3. The programmable device of claim 1, wherein the memory requires aligned memory access requests.

4. The programmable device of claim 1, wherein the unaligned access adapter performs two aligned memory access requests to the memory after receiving the unaligned memory access request.

5. The programmable device of claim 4, wherein data in the unaligned access address range is obtained in response to the two aligned memory access requests.

6. The programmable device of claim 5, wherein the data in the unaligned address range is provided to the processor core in response to the unaligned memory access request.

7. The programmable device of claim 4, wherein data received in response to the two aligned memory access requests are combined.

8. The programmable device of claim 1, wherein the unaligned access adapter forwards an aligned memory access request from the processor core to memory.

9. A method comprising:
   receiving a memory access request from a master component included on a programmable device, the memory access request received at an unaligned access adapter operable to receive memory access requests from a plurality of master components, wherein the plurality of master components includes at least a processor core and a peripheral implemented on the programmable device, and wherein a memory access request received from the processor core is received via a processor core master data port;
   determining whether the memory access request is unaligned;
   in response to determining that the memory access request is unaligned, sending a plurality of aligned memory access requests from the unaligned access adapter to the memory, wherein the unaligned access adapter is a component available from a library of components, and wherein the unaligned access adapter stalls the processor core responsive to receiving the memory access request that is unaligned;
   receiving a plurality of responses from the memory corresponding to the plurality of aligned memory requests, wherein the memory access request corresponds to an unaligned access address range that is obtained from responses to the plurality of aligned memory accesses;
   combining and truncating the plurality of responses corresponding to the plurality of aligned memory access requests to form a combined response; and
   providing the combined response to the master component.

10. The method of claim 9 further comprising sending a wait signal to the master component.

11. The method of claim 9, wherein the memory access request corresponds to an unaligned access address range.

12. The method of claim 9, wherein the memory requires aligned memory accesses.

13. The method of claim 9, wherein the unaligned access adapter performs two aligned memory accesses to the memory responsive to receiving the memory access request that is unaligned.

14. The method of claim 13, wherein data in an unaligned access address range is obtained from responses to the two aligned memory accesses.

15. The method of claim 14, wherein the data in the unaligned address range is provided to the master component in response to the memory access request.

16. A device comprising:
   an unaligned access adapter operable to:
   receive memory access requests from a plurality of master components, wherein the plurality of master components includes at least a processor core and a peripheral implemented on the programmable device, and wherein a memory access request received from the processor core is received via a processor core master data port;
   determine whether the memory access request is unaligned;
   send a plurality of aligned memory access requests from the unaligned access adapter to the memory in response to determining that the memory access request is unaligned, wherein the unaligned access adapter is a component available from a library of components, and wherein the unaligned access adapter is operative to stall the processor core responsive to receiving the memory access request that is unaligned;
   receive a plurality of responses from the memory corresponding to the plurality of aligned memory requests, wherein the memory access request corresponds to an unaligned access address range that is obtained from responses to the plurality of aligned memory accesses;
   combine and truncate the plurality of responses corresponding to the plurality of aligned memory access requests to form a combined response; and
   provide the combined response to the master component.

17. The programmable device of claim 1, wherein the memory access request is an aligned access request.

18. The programmable device of claim 1, wherein the memory access request is an unaligned access request.

* * * * *